(12) United States Patent
Adir et al.

(10) Patent No.: US 8,224,614 B2
(45) Date of Patent: Jul. 17, 2012

(54) GENERATING A COMBINATION EXERCISER FOR EXECUTING TESTS ON A CIRCUIT

(75) Inventors: Allon Adir, Kiryat Tivon (IL); Maxim Golubev, Haifa (IL); Andrey Klinger, Haifa (IL); Amir Nahir, Kfar Vitkin (IL)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 12/609,022

(22) Filed: Oct. 30, 2009

(65) Prior Publication Data

US 2011/0106482 A1 May 5, 2011

(51) Int. Cl.
*G01R 31/00* (2006.01)
*G06F 19/00* (2011.01)

(52) U.S. Cl. ............................................ 702/119; 716/5

(58) Field of Classification Search .................. 702/117, 702/118, 119, 120, 123, 182; 703/28; 714/26, 714/32, 48; 716/102, 106, 112; 718/101
See application file for complete search history.

(56) References Cited

U.S. PATENT DOCUMENTS

| 2004/0168106 A1* | 8/2004 | Cherny et al. .................... 714/32 |
| 2006/0218513 A1* | 9/2006 | Dozorets et al. .................. 716/5 |
| 2009/0287958 A1* | 11/2009 | Bhatt et al. ....................... 714/26 |

* cited by examiner

*Primary Examiner* — John H Le
(74) *Attorney, Agent, or Firm* — Glazberg Ziv

(57) ABSTRACT

A first and second test templates are combined to a combination test template. The combination test template may be configured to execute the first and second test templates in combination, and based upon a definition. The combination test template may execute tests in sequential order, concurrently, a combination thereof or the like. The first test template may be configured to be executed by a single-core machine and may be transformed to a multi-core test template that is configured to be executed on a multi-core machine in parallel to other tests. By utilizing the disclosed subject matter, a reduction in overhead of executing the first and second test templates may be achieved; a predetermined interleaving may be performed and a user may control the manner in which the combination test template is executing the first and second test templates. Additionally, reuse of pre-silicon test templates in post-silicon stage may be achieved.

23 Claims, 3 Drawing Sheets

GENERATING A COMBINATION EXERCISER FOR EXECUTING TESTS ON A CIRCUIT

BACKGROUND

The present disclosure relates to testing of computerized systems, in general, and to post-silicon testing of multi-core computerized systems, in particular.

Computerized devices control almost every aspect of our life—from writing documents to controlling traffic lights. However, computerized devices are bug-prone, and thus require a testing phase in which the bugs should be discovered. The testing phase is considered one of the most difficult tasks in designing a computerized device. The cost of a bug may be enormous, as its consequences may be disastrous. For example, a bug may cause the injury of a person relying on the designated behavior of the computerized device. Additionally, a bug in hardware or firmware may be expensive to fix, as patching it requires call-back of the computerized device. Hence, many developers of computerized devices invest a significant portion, such as 70%, of the development cycle to discover erroneous behaviors of the computerized device.

Some of the testing of a target computerized system is performed in a pre-silicon stage, in which the target computerized system is described using a descriptive language, such as for example Verilog or VHDL. The target computerized system may be a processor, a microprocessor, an electronic circuit, an integrated circuit, a chipset, a computerized device comprising a processor or the like. During the pre-silicon phase, a test template may be designed to enable testing of the target computerized system. The test template may be designed to a single-core configuration of the target computerized system. The test template may define one or more tests and may be executed multiple number of times, each time inducing a different execution, such as by having different input values. An exemplary test template may be "two floating point instructions and then three memory stores" which defines several different tests, each utilizing specific commands that correlate to those defined by the test template. In some cases, a test template may correlate to a single test.

Some of the testing of the target computerized system is performed in a post-silicon stage. The post-silicon stage is after the target computerized system is produced in accordance with the description provided by the descriptive language, also referred to as a circuit or silicon. It will be noted that the circuit may be different than the target computerized system, such as for example comprising only a chip without a casing, being assembled manually, being assembled partially and the like.

During the post-silicon stage the circuit may be tested using a test that is configured to be executed by the circuit. The test may be configured to a multi-core configuration or a single-core configuration of the target computerized system. In case the circuit is a multi-core circuit comprising of more than a single core, executing a test configured to a single-core configuration may be inefficient as the circuit may only execute one such test at a time, utilizing a single core without making any use of the rest of the cores of the circuit. Alternatively, executing one or more tests on a multi-core circuit may provide erroneous results if a portion of the one or more tests is configured to a single-core configuration. The portion of the one or more tests may access shared resources in an unprotected manner or an unsynchronized manner. It will be noted that a test may be determined based on a test template. The test template may be configured to define tests which are configured to a multi-core configuration, a single-core configuration or both.

BRIEF SUMMARY OF THE INVENTION

One exemplary embodiment of the disclosed subject matter is a computerized apparatus comprising a processor; an interface for obtaining a first test template and a second test template; an interface for obtaining a combination definition; and a combination module configured to generate a combination test template, the combination test template is configured to execute a first test associated with the first test template and a second test associated with the second test template in accordance with the combination definition, the combination test template is associated with a circuit.

Another exemplary embodiment of the disclosed subject matter is a method in a computerized environment, the method comprising: obtaining a first test template and a second test template; obtaining a combination definition; and generating a combination test template, the combination test template is configured to execute a first test associated with the first test template and a second test associated with the second test template in accordance with the combination definition, the combination test template is associated with a circuit; the generating a combination test template is performed by a processor; whereby the first and second test templates are transformed to the combination test template.

Yet another a computer program product comprising: a computer readable medium; a first program instruction for obtaining a first test template and a second test template; a second program instruction for obtaining a combination definition; and a third program instruction for generating a combination test template, the combination test template is configured to execute a first test associated with the first test template and a second test associated with the second test template in accordance with the combination definition, the combination test template is associated with a circuit; wherein the first, second and third program instructions are stored on the computer readable medium.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
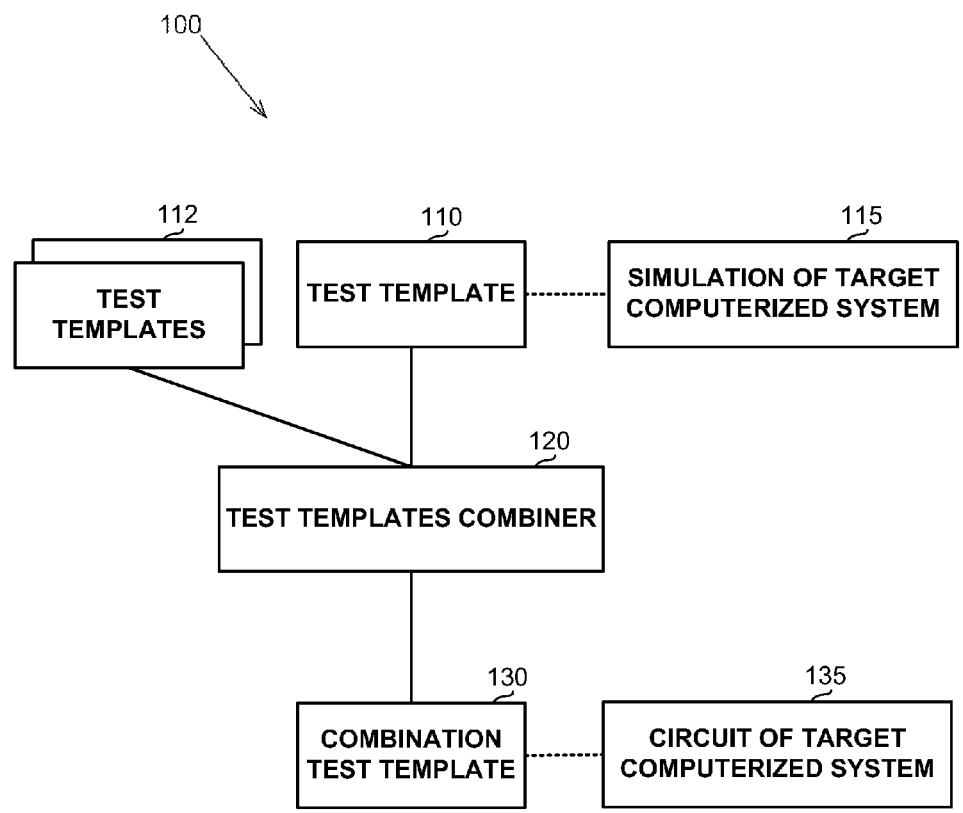
FIG. 1 shows a computerized environment in which the disclosed subject matter is used, in accordance with some exemplary embodiments of the subject matter.

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to reuse in the post-silicon stage a test template used in the pre-silicon stage. Another technical problem is to enable a test template to benefit from the scaling in the number of cores in the target computerized device. Yet another problem is to enable utilization of a test template configured to be utilized in associating with a single-core computerized device on a multi-core computerized device, without requiring significant manual effort. Yet another technical problem dealt with by the disclosed subject matter is to enable execution of multiple tests on the target computerized device in combination, without requiring significant overhead.

One technical solution is to transform a single-core test template to a multi-core test template. Another technical solution is to transform the single-core test template to utilize an environment emulation module when accessing a resource that may be shared or when performing other types of environment requests. Yet another solution is to combine several test templates together by executing them concurrently, sequentially or in a combination thereof. The combination may be performed using a combination test template which may be treated as a single test template having multi-core or multi-threading activities.

One technical effect of utilizing the disclosed subject matter is automatically generating a multi-core test template to be utilized in the post-silicon stage. Another technical effect is providing a combination test template. A test defined by the combination test template may induce an overhead associated with executing one test, while in affect it executes several tests. Yet another technical effect is generating a multi-core test template which may be loaded into memory once, regardless of a number of cores that are utilized by the multi-core test template. Yet another technical effect is utilizing a single-core test template in a multi-core environment, and enabling the single-core test template to benefit from the scale in number of cores.

Referring now to FIG. 1 showing a computerized environment in which the disclosed subject matter is used, in accordance with some exemplary embodiments of the subject matter. A computerized environment 100 comprises a test template 110, test templates 112 and a test templates combiner 120.

In some exemplary embodiments, the test template 110 may define one or more tests. The one or more tests may be configured to be executed by a simulation 115. The simulation 115 may simulate a target computerized system. The simulation 115 may be based on a definition of the target computerized system, such as provided by VHDL, Verilog, SystemC and the like. In the present disclosure, executing a test associated with a test template by a target computerized system, a circuit, a simulation or the like may be referred to as executing the test template by the target computerized system, the circuit, the simulation or the like.

In some exemplary embodiments, the test template 110 is a single-core test template. The test template 110 may be a multi-core test template. The test templates 112 may be one or more test templates that may be single-core test templates, multi-core test templates, a combination thereof or the like.

In some exemplary embodiments, a single-core test template may be configured to be executed by a single-core implementation of the target computerized system. A single-core test template may not be configured to take into account an interaction with another core. For example, in case two or more cores have access to a shared resource, a synchronization method or another non-collision mechanism may be utilized. A single-core test template may be a multi-threaded test template which executes several threads within a single core of the target computerized system or the simulation 115. The single-core test template may be a test template designed to be utilized in a pre-silicon stage.

In some exemplary embodiments of the disclosed subject matter, the test templates combiner 120 is configured to combine the test template 110 with the test templates 112. The test templates combiner 120 may produce a combination test template 130. The combination test template 130 may execute the test template 110 and the test templates 112 using a single processing entity, such as a thread, a core, a process or the like, or using several processing entities. The combination test template 130 may be produced based upon user preferences, definitions, rules, commands, parameters or the like. The combination test template 130 may be a multi-core test template or a single-core test template. The combination test template 130 may allocate a single core for each of the test template 110, test templates 112. An allocated core may be a predetermined core, a core that is determined on-the-fly in accordance with some rules, commands or preferences or the like. The combination test template 130 may utilize a predetermined one or more processing units of a circuit 135 of the target computerized system to perform a test associated with a test template.

The test templates combiner 120 may determine a method of interleaving between the test template 110, and the test templates 112. The method of interleaving may be concurrent (also referred to as parallel), sequential or partially sequential. In some exemplary embodiments, an allocated processing entity may execute one single-core test template, such as the test template 110, in parallel to other cores. The allocated processing entity may execute two or more test templates, such as the test template 110 and the test templates 112, sequentially. The allocated processing entity may execute a portion of the test templates in a predetermined order or in an order that is determined in accordance with some rules, commands, definitions or preferences. The allocated processing entity may execute a first portion of the test templates sequentially and in parallel to a second portion of the test templates.

The test templates combiner 120 may be configured to transform a test template 110 which is a single-core test template to a multi-core test template (not shown). The multi-core test template may be configured to be executed by the circuit 135 of the target computerized system. The circuit 135 may be a multi-core circuit.

Figure 2:
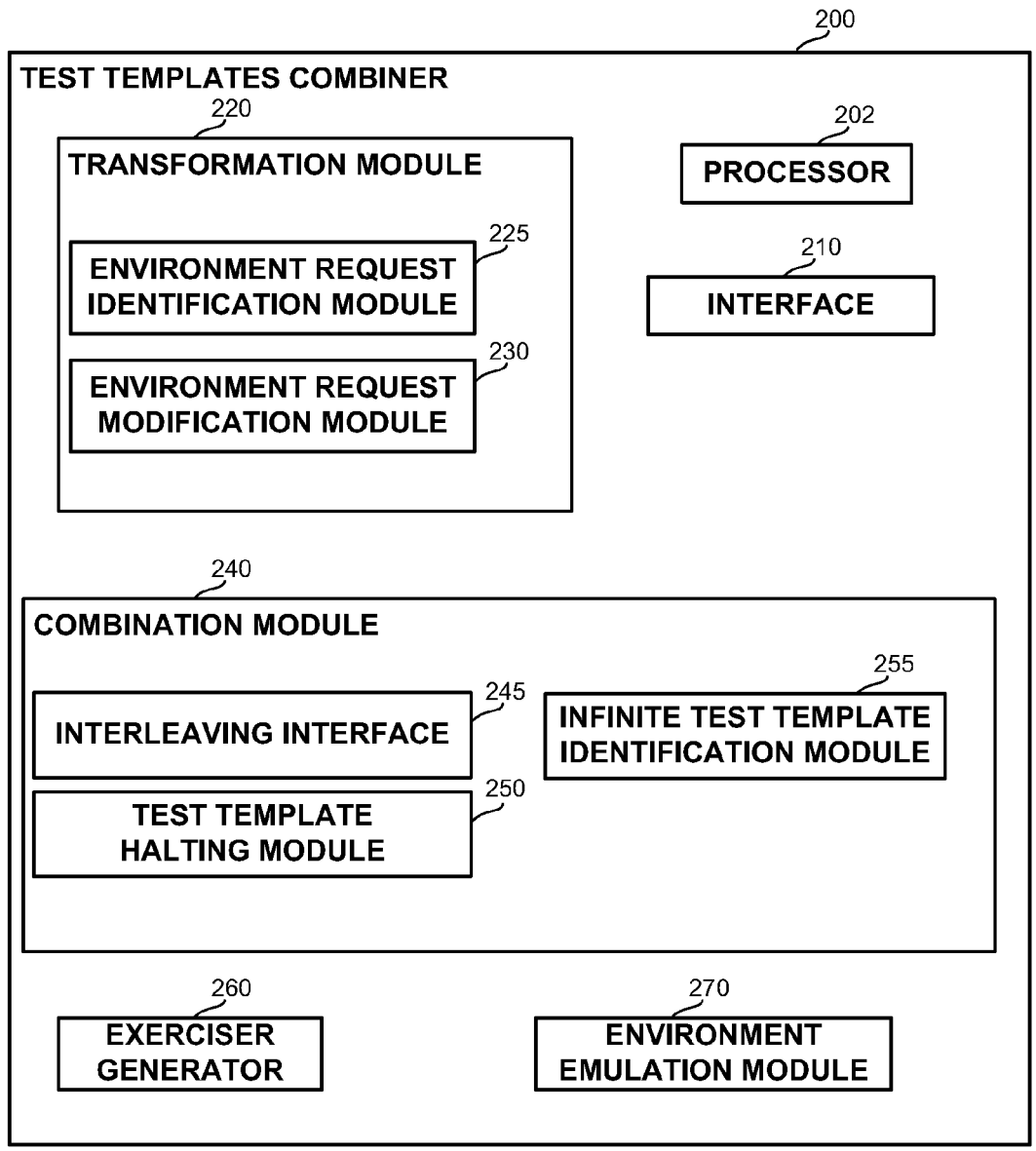
FIG. 2 shows a block diagram of a test templates combiner in accordance with some exemplary embodiments of the disclosed subject matter.

Referring now to FIG. 2 showing a block diagram of a test templates combiner in accordance with some exemplary embodiments of the disclosed subject matter. A test templates combiner 200, such as 120 of FIG. 1, may comprise a combination module 240.

The test templates combiner 200 may additionally comprise an interface 210. The interface may be used to retrieve, receive or otherwise obtain any input to the test templates adapter 200 such as a single-core test template. The interface 210 may be utilized to send, transmit, relay or otherwise convey an output of the test templates adapter 200 such as a multi-core test template. The interface 210 may be utilized to receive input from a user, a file such as a configuration file, parameters, commands or the like. The interface 210 may be utilized to obtain a test template. The interface 210 may be utilized to obtain a combination definition.

In some exemplary embodiments, the test templates combiner 200 comprises a processor 202. The processor 202 may be a Central Processing Unit (CPU), a microprocessor, an electronic circuit, an Integrated Circuit (IC) or the like. The processor 202 may be utilized to perform computations required by the test templates combiner 200 or any of it subcomponents.

In some exemplary embodiments of the disclosed subject matter, the combination module 240 may be configured to combine a first test template, such as test template 110 of FIG. 1, and a second test template, such as test templates 112 of FIG. 1, to a combined test template, such as 130 of FIG. 1. The combined test template may be configured to execute the first test template and the second test template. In some exemplary embodiments, the combination module 240 may combine two or more multi-core test templates. In some exemplary embodiments of the disclosed subject matter, a test template that is provided to the combination module 240 may be a single-core test template that was transformed to a multi-core test template in accordance with the disclosed subject matter.

In some exemplary embodiments, the combination module 240 comprises an interleaving interface 245. The interleaving interface may determine a method of interleaving between the first test template and the second test template. The method of interleaving may be sequential interleaving such that a first test template is executed and after the execution terminates the second test template is executed. The method of interleaving may be concurrent interleaving such that the first test template is executed on a first core in parallel to the execution of the second test template by a second core. The method of interleaving may be partial sequential interleaving, which is a combination of the sequential and concurrent interleavings. For example, a first, second and third test templates may be combined such that the first and second test templates are executed in sequence by a first core, whereas the third test template is executed in parallel by a second core.

In some exemplary embodiments of the disclosed subject matter, the interleaving interface 245 is configured to utilize a combination definition such as for example user definitions or similar configuration files that identify a set of test templates to combine or a method of interleaving. For example, an allocation file may determine that a first test template, short.ex, is executed by four entities in the circuit, also referred to as processing units, such as for example threads, processes or cores. The allocation file may further determine that a second test template, long.ex, is executed in parallel by four different entities. The allocation file may comprise two lines, the first line may be "short.ex 0 1 4 5" and the second line may be "long.ex 2 3 6 7". The numbers in the first and second line may be entity identification. For example, identification of threads as may be defined in a system configuration of the circuit or target computerized system.

In some exemplary embodiments, a test template requires utilization of specific entity of the circuit, such as a predetermined thread. The configuration file may confirm with such requirement. The combination module 240 may validate that such a requirement is held. The requirement may be validated at run-time or load-time of the combination test template.

In some exemplary embodiments the allocation file may comprise implicit identifications of processing unit. In some exemplary embodiments, an implicit identification such as a wildcard, for example an asterisk ("*") may indicate all other entities that were not explicitly mentioned in the allocation file. For example a third line "mid.ex *" in the allocation file may indicate that any other entity besides entities 0, 1, 2, 3, 4, 5, 6 and 7 of the circuit or assigned to execute a third test template, named mid.ex. A use of wildcards may be useful for different circuit having different definitions in their respective system configuration file. For example, a first circuit may have ten threads (0-9) while a second circuit may have eighteen threads (0-17). The interleaving interface 245 may determine an interleaving based on the allocation file for both the first circuit and the second circuit.

In some exemplary embodiments, the allocation file may define a sequence of test templates to be executed, such as for example an allocation file consisting a line "short1.ex short2.ex short3.ex 0 1" may determine that three test templates be executed in sequence by entities 0 and 1. In some exemplary embodiments, the entities 0 and 1 may execute a short1.ex test template one or more times. Afterwards, the entities 0 and 1 may determine, based on number of execution, elapsed time or the like, that the execution of short1.ex should be completed. The entities 0 and 1 may synchronize and begin execution of a short2.ex test template one or more times. In a similar manner, the entities 0 and 1 may determine completion of the short2.ex test and begin execution of a short3.ex test template. In some exemplary embodiments, after a last execution of a test template is completed the entities 0 and 1 may finalize execution. In other exemplary embodiments, after the last execution is completed the entities 0 and 1 may synchronize and begin execution of a first test template defined, such as the short1.ex test.

In some exemplary embodiments, the allocation file may define a partial sequential interleaving. The allocation file may comprise several lines, each line describing a group of one or more tests to be executed in sequential order as disclosed above. The groups defined by the lines are executed in parallel to one another as disclosed above. In some exemplary embodiments, the allocation file may define combination of test templates to be executed in parallel. For example, the allocation file may be have a first line "short1.ex short2.ex 0 2" and a second line "long1.ex long2.ex long3.ex 1 3 4 5 6". The allocation file may imply 2×3=6 parallel executions, in which short1.ex is executed in parallel to long1.ex, to long2.ex and to long3.ex and in addition short2.ex is executed in parallel to long1.ex, to long2.ex and to long3.ex. The combination test template may repeatedly cycle through all possible combinations or a portion thereof, and execute each combination one or more times depending on preferences, user defined parameters, rules, commands or the like.

In some exemplary embodiments, the combination module 240 comprises an infinite test template identification module 255. The infinite test template identification module 255 may determine whether a test template comprises an infinite behavior such as an endless loop. The infinite test template identification module 255 may perform a static analysis of the test template to determine whether it may comprise an endless loop. The infinite test template identification module 255 may obtain user identification of infinite test templates, such as by a configuration file, an input by a user, a documentation, a name associated with the test template such as a prefix of "inf" or the like.

In some exemplary embodiments, the combination module 240 comprises a test template halting module 250. The test template halting module 250 may add to the combination test template a behavior of stopping an execution of a test template. A test template may be stopped in case another test template failed and discovered a bug. A test template may be stopped after a predetermined period of time such as defined by a user. A test template which is an infinite test template may require to be halted after some finite test templates have finished execution. It will be noted that in some exemplary embodiments, when executing an infinite test template in parallel to one or more finite test templates, the infinite test template may be allowed to be executed without being stopped. In such a case, the infinite test template may be halted by a user desiring to inspect an outcome of the testing of the circuit. The test template halting module 250 may provide a halting behavior using a counter interrupt, such as a mechanism that may raise an interrupt every predetermined period of time. The interrupt may be utilized to initiate a halting of an execution of a test template. In some exemplary embodiments, an entity that executed a test template that was halted may be put into a pending state to provide for synchronization with other entities.

An exerciser generator 260 may generate an exerciser (not shown). The exerciser may be configured to execute a combination test associated with the combination test template. In some exemplary embodiments, the exerciser generator 260 may generate the exerciser based on predetermined rules, definitions, configuration, parameters or the like. The exerciser may be configured to execute a test on a predetermined circuit. The exerciser may perform a one or more executions in accordance with one or more tests. The exerciser may load the combination test as a single test, thus reducing required overhead as may be the case if several exercisers are used. The exerciser may provide each core of the circuit, or another similar processing unit, with a separate copy of random data that may be used to comprise a test code, data areas from which context may be loaded and the like. The exerciser may load to memory a single copy of the common code. In an exemplary embodiment of the disclosed subject matter, the exerciser partitions memory image to several sections comprising: a first section for an interrupt handler; a second section for a generic kernel code and library functions; a third section for a data area; a fourth section for code area which is partitioned such that each entity, such as a thread, is assigned a separate exclusive code area; a fifth section for heap which is partitioned such that each entity is assigned a separate exclusive heap.

Upon execution of a test, the exerciser may load a multi-core test associated with the mutli-core test template to memory. The loaded memory may comprise interrupt handlers, kernel and library functions code and data tables which describe variables. Each entity, such as a thread, may execute a shared code such as for example a standard procedure of circuit wake-up. The shared code may provide for initialization of each test by examining the identity of the entity and copying a private code relevant for a portion of the multi-core test, such as a portion associated with a single-core test, to a designated code area. In some cases, heap initializations and the like may also be performed. After the portion is properly initialized the private code area may be executed. The private code may address an environment request to an environment emulation module, such as the environment emulation module 270.

In some exemplary embodiments, the test templates combiner 200 further comprises a transformation module 220. The transformation module 220 may be configured to transform a single-core test template to a multi-core test template. The transformation module 220 may modify the single-core test template such that implicit synchronization of access to shared resource is provided.

The transformation module 220 may further comprise an environment request identification module 225. The environment request identification module 225 may be configured to identify an environment request performed by a test template. The environment request may be a request to an environment in which the test template is executed, such as the computerized device executing the test template. Note that the computerized device may be for example a simulator, such as 115 of FIG. 1, a circuit, such as 135 of FIG. 1, a target computerized system and the like.

An environment request may be for example an identification query. The identification query may be a request for an identification characteristic of a core executing the test template or any of its sub-entities. For example, the identification query may be thread identification query, core identification query or the like.

An environment request may be for example an environment status query. The environment status query may be a request to provide a status characteristic of a computerized environment executing the test template. The environment status query may be querying number of concurrently executed processes, threads or the like.

An environment request may be for example resource request, such as memory allocation request. The memory allocation request may be to be provided with a set of one or more memory addresses which are allocated to the test. The allocated memory may be internal memory of the target computerized system (or associated simulator or circuit). The allocated memory may be memory mapped IO such as for example memory of an external device, a communication port, a display, a bus or the like.

In some exemplary embodiments of the disclosed subject matter, the transformation module 220 may comprise an environment request modification module 230. The environment request modification module 230 may modify an environment request from a computerized device executing the test to an environment request from an environment emulation module 270. The environment request modification module 230 may replace, modify or change the environment request such that the environment request is addressed to the environment emulation module 270 instead of the computerized device.

In some exemplary embodiments, the environment emulation module 270 is comprised by the tests template combiner 200. In other exemplary embodiments, the environment emulation module 270 is an external module that is not comprised by the test templates combiner 200. In some exemplary embodiments, the environment emulation module 270 may be a third-party module that is not associated with the test templates combiner 200.

The environment emulation module 270 may be configured to provide a response for an environment request. The response may mask the internals of a computerized device running a test such that the test is being informed of different characteristics, statuses, parameters or the like associated with the computerized device. For example, the environment emulation module 270 may provide a core identification value which is different than that core identification of a core executing the test. The environment emulation module 270 may provide for a partitioning of resources. The partitioning may be not affected by the number of cores in the computerized device. The environment emulation module 270 may create conflict avoidance by hiding the cores from each other, or by hiding a first core from a second core. The environment emulation module 270 may provide an executing environment which simulates a single-core circuit, while being executed by a multi-core circuit. The multi-core circuit may be executing other tests in parallel utilizing different cores. It will be noted that in some exemplary embodiments, the environment emulation module 270 provides an automatic partitioning of resources which is achieved regardless of the number of cores and other internals that may depend on circuit configuration.

The environment emulation module 270 may be configured to divide a resource between all cores. In some cases, such as when the resource is limited and cannot be effectively divided to each of the cores, the resource may be divided between a portion of the cores. A resource may be divided equally between cores or in a different manner, such as by providing a core that is likely to require the resource a bigger portion of the resource or the like.

In an exemplary embodiment of the disclosed subject matter, the test templates combiner 200 may modify a single-core test template such that it will utilize a shared and single copy of read-only resources, such as interrupt handlers, library functions and the like. The single copy of read-only resources, also referred to as common code, may be configured to be aware of a core-on-chip scenario and have access to the internals of the circuit without a use of an additional proxy added by the disclosed subject matter.

Figure 3:
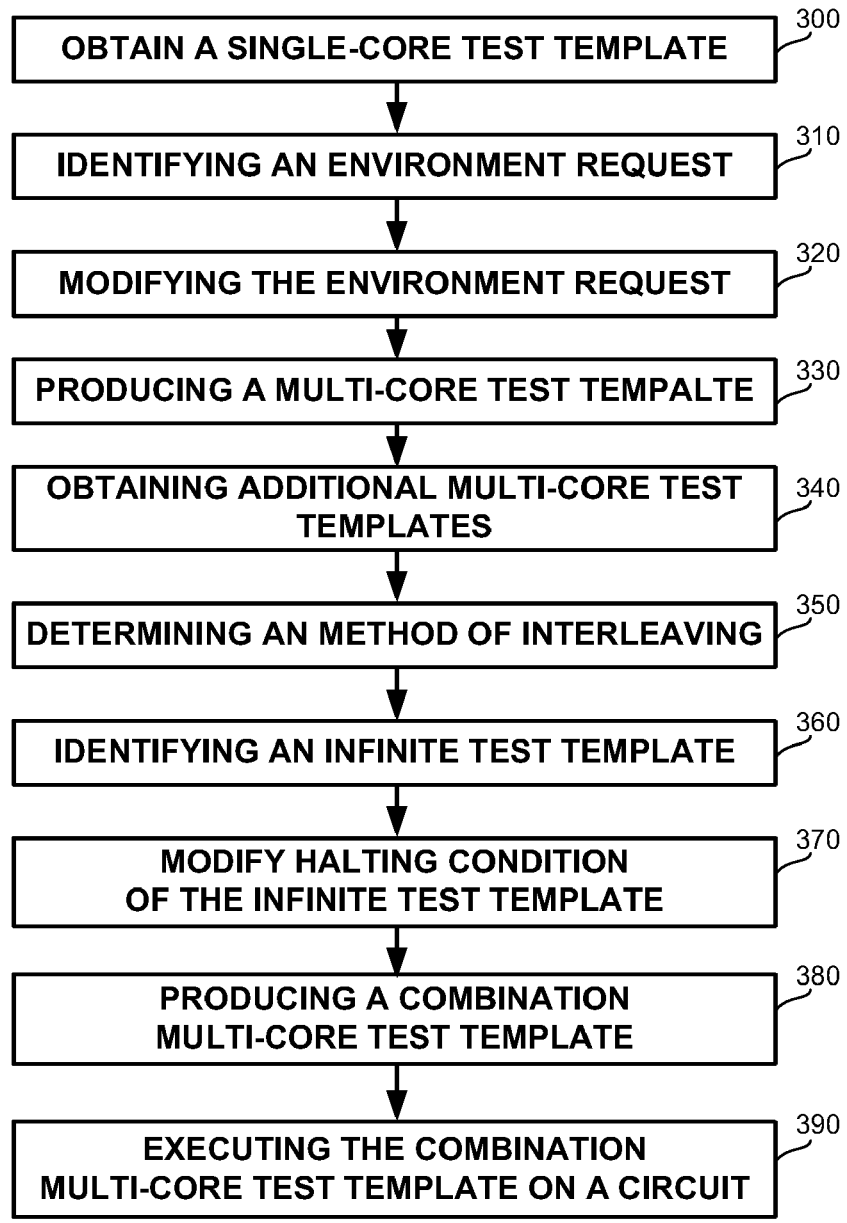
FIG. 3 shows a flowchart diagram of a method in accordance with some exemplary embodiments of the disclosed subject matter.

Referring now to FIG. 3 showing a flowchart diagram of a method in accordance with some exemplary embodiments of the disclosed subject matter.

In step 300, a single-core test template may be obtained, such as by an interface such as 210 of FIG. 2.

In step 310, an environment request of the single-core test template may be identified. The identification may be performed by an environment request identification module, such as 225 of FIG. 2.

In step 320, the environment request may be modified. The modification may be performed by an environment request modification module 230 of FIG. 2.

In step 330, a multi-core test template may be produced. The multi-core test template may be produced by a transformation module, such as 220 of FIG. 2.

In step 340, one or more additional multi-core test templates are obtained. In some exemplary embodiments, the one or more additional multi-core test templates are an output of a transformation module, such as 220 of FIG. 2.

In step 350, a method of interleaving may be determined. In some exemplary embodiments, the method of interleaving is determined by an interleaving interface, such as 245 of FIG. 2. The method of interleaving may be determined based on a combination definition. In accordance with the combination definition, a test template may be associated with one or more processing units, such as a first thread and a second thread.

In step 360, an infinite test template may be identified. The identification may be performed by an infinite test template identification module 255.

In step 370, a halting condition of the infinite test template may be modified. The halting condition may be modified by a test template halting module, such as 250 of FIG. 2. In some exemplary embodiments, a halting condition of a finite test template may be modified.

In step 380, a combination test template may be produced. The combination test template may be produced by a combination module, such as 240 of FIG. 2.

In step 390, the combination test template may be executed on a circuit. In some exemplary embodiments, the combination multi-core test template may be executed by an exerciser, such as generated by an exerciser generator 260 of FIG. 2.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computerized apparatus comprising:
   a processor;
   first interface for obtaining a first test template and a second test template;
   second interface for obtaining a combination definition; and
   a combination module configured to generate a combination test template, the combination test template is configured to execute a first test associated with the first test template and a second test associated with the second test template in accordance with the combination definition, the combination test template is associated with a circuit;
   wherein the combination definition comprises an identification of a test template and an at least one identification of a processing unit designated to perform a test associated with the test template.

2. The computerized apparatus of claim 1, wherein a third test template comprises the first test template and the second test template, the third test template is a multi-core test template.

3. The computerized apparatus of claim 1, wherein the processing unit is selected from the group comprising of a process, a thread and a core.

4. The computerized apparatus of claim 1, wherein the identification is an implicit identification of the processing unit.

5. The computerized apparatus of claim 1, wherein said combination module comprises an interleaving interface for determining a method of interleaving between the first test template and the second test template based on the combination definition.

6. The computerized apparatus of claim 5, wherein the method of interleaving is selected from the group consisting of concurrent interleaving, sequential interleaving and partial sequential interleaving.

7. The computerized apparatus of claim 5, wherein said combination module comprises a test template halting module.

8. The computerized apparatus of claim 7, wherein said combination module further comprises an infinite test template identification module.

9. The computerized apparatus of claim 1, wherein the first test template is a single-core test template;
   the computerized apparatus further comprising a transformation module configured to transform the first test template to a multi-core test template, the multi-core test template defines a test that is configured to be executed by the circuit in parallel to one or more additional tests, the transformation module comprises:
   an environment request identification module for identifying an environment request from the circuit by the test; and
   an environment request modification module for modifying the environment request from the circuit to an environment request from an environment emulation module.

10. The computerized apparatus of claim 9, wherein the first test template is selected from a group consisting of a single-threaded test template and a multi-threaded single-core test template.

11. The computerized apparatus of claim 9, wherein the environment request is selected from the group consisting of an identification query, an environment status query and a resource request.

12. The computerized apparatus of claim 9 further comprising an exerciser generator configured to generate an exerciser that is designed to execute the test on the circuit.

13. The computerized apparatus of claim 9 further comprising the environment emulation module.

14. A method in a computerized environment, the method comprising:
   obtaining a first test template and a second test template;
   obtaining a combination definition; and
   generating a combination test template, the combination test template is configured to execute a first test associated with the first test template and a second test associated with the second test template in accordance with the combination definition, the combination test template is associated with a circuit; wherein the combination definition comprises an identification of a test template and an at least one identification of a processing unit designated to perform a test associated with the test template; said generating a combination test template is performed by a processor;

whereby the first and second test templates are transformed to the combination test template.

15. The method of claim 14, wherein said generating the combination test template comprises associating a test and an at least one processing unit based on the combination definition, the test is associated with a test template.

16. The method of claim 14, wherein said generating the combination test template comprises determining a method of interleaving between the first test template and the second test template based on the combination definition.

17. The method of claim 14, wherein said generating the combination test template comprises modifying a halting condition of a test associated with a test template.

18. The method of claim 14, wherein said generating the combination test template comprises identifying an infinite test.

19. The method of claim 18, wherein said generating the combination test template comprises modifying a halting condition of an infinite test associated with a test template.

20. The method of claim 14 further comprises executing a test associated with the combination test template on the circuit.

21. The method of claim 14, wherein the first test template is a single-core test template, the method further comprises transforming the first test template to a multi-core test template, the multi-core test template defines a test that is configured to be executed by the circuit in parallel to one or more additional tests.

22. The method of claim 21 wherein said transforming the first test template to a multi-core test template comprises:
   identifying an environment request from the circuit by the first test template; and
   modifying the environment request from the circuit to an environment request from an environment emulation module.

23. A non-transitory computer readable medium embodying a computer program product, said computer program product comprising:
   a first program instruction for obtaining a first test template and a second test template;
   a second program instruction for obtaining a combination definition; and
   a third program instruction for generating a combination test template, the combination test template is configured to execute a first test associated with the first test template and a second test associated with the second test template in accordance with the combination definition, the combination test template is associated with a circuit, wherein the combination definition comprises an identification of a test template and an at least one identification of a processing unit designated to perform a test associated with the test template;
   wherein said first, second and third program instructions are stored on said computer readable medium.

* * * * *